US012368411B2

(12) United States Patent
Amarnath et al.

(10) Patent No.: US 12,368,411 B2
(45) Date of Patent: Jul. 22, 2025

(54) PEAK DETECTION CIRCUIT TO DETECT AND CONTROL OUTPUT SWING LEVEL OF VOLTAGE CONTROLLED OSCILLATOR

(71) Applicant: Signalchip Innovations Private Limited, Bangalore (IN)

(72) Inventors: Kishen Amarnath, Bangalore (IN); Himamshu Gopalakrishna Khasnis, Bangalore (IN)

(73) Assignee: SIGNALCHIP INNOVATIONS PRIVATE LIMITED, Bangalore (IN)

( * ) Notice: Subject to any disclaimer, the term of this patent is extended or adjusted under 35 U.S.C. 154(b) by 0 days.

(21) Appl. No.: 18/401,206

(22) Filed: Dec. 29, 2023

(65) Prior Publication Data

US 2024/0223128 A1 Jul. 4, 2024

(30) Foreign Application Priority Data

Dec. 31, 2022 (IN) .............................. 202241077698

(51) Int. Cl.
*H03B 5/12* (2006.01)
(52) U.S. Cl.
CPC ... *H03B 5/1212* (2013.01); *H03B 2200/0088* (2013.01)

(58) Field of Classification Search
CPC .................... H03B 5/1212; H03B 2200/0088
USPC ....................................... 331/117 R, 185, 183
See application file for complete search history.

(56) References Cited

U.S. PATENT DOCUMENTS

| 6,680,655 B2 * | 1/2004 | Rogers ................. H03B 5/1231 331/109 |
| 7,123,113 B1 * | 10/2006 | Brennan ................... H03L 5/00 331/74 |

* cited by examiner

*Primary Examiner* — Arnold M Kinkead

(57) ABSTRACT

A circuit for detecting, controlling, and maintaining optimal output swing for a noise performance at a given power with an improved operating range is provided. The circuit includes a Voltage Controlled Oscillator (VCO) (102), a peak detection circuit (104) and an Analog Bias Controller (108). The VCO includes a bias control that is connected to the output swing of the VCO. The peak detection circuit is added at an output of the VCO. The peak detection circuit detects an output swing of the VCO and controls the output swing by controlling bias of the VCO using a feedback loop. An output voltage of the peak detection circuit is proportional to the output swing of the VCO. The Analog Bias Controller compares the output voltage of the peak detection circuit to a reference (VDD) to maintain the output swing of the VCO at a constant level that corresponds to an internally generated reference.

13 Claims, 10 Drawing Sheets

PEAK DETECTION CIRCUIT TO DETECT AND CONTROL OUTPUT SWING LEVEL OF VOLTAGE CONTROLLED OSCILLATOR

BACKGROUND

Technical Field

The embodiments herein generally relate to a peak detection circuit, and more particularly, to the peak detection circuit at an output of a Voltage Controlled Oscillator (VCO) to detect, control and maintain optimal output swing for best noise performance at given power with an improved operating range.

Description of the Related Art

A voltage-controlled oscillator (VCO) is an electronic oscillator whose oscillation frequency is controlled by a voltage input. The applied input voltage determines the instantaneous oscillation frequency. Consequently, a VCO can be used for frequency modulation (FM) or phase modulation (PM) by applying a modulating signal to the control input. A VCO is also an integral part of a phase-locked loop. The voltage-controlled oscillator (VCO) is a key component in both wireless and wireline communication systems. For Radio Frequency (RF) applications as in wireless communication systems, the local oscillator is an essential component to provide a local carrier to the mixer for up- or down-conversion. The VCO is predominantly employed as the local oscillator for such applications, either as a free-running circuit or as part of a PLL. The Local oscillators have to meet stringent phase noise requirement to avoid the reciprocal mixing, or spectral overlap between two adjacent frequency-converted signals.

There are many different types of voltage-controlled oscillators (VCOs), with one type being an inductor-capacitor (LC) oscillator. For very high frequency applications, LC VCOs with frequency stability and superior phase noise performance are desired. The main components of a LC VCO typically include a differential LC resonant tank or LC tank which includes transistors. The amplitude of the oscillations of the LC tank is affected by Q of the LC tank and the tail current of the LC oscillator. The tail current or the current through the LC tank depends on the bias applied to the gate of the tail current device. Due to process variations, the current (transconductance) through this tail current device may vary for a fixed bias voltage.

In the LC-based VCO, the challenge is to maintain the output swing across frequencies. The output swing of the VCO varies across frequencies due to variation in Q and the output response of the circuit. In the existing solutions, the bias is controlled using an additional internal voltage, which may estimate the output swing, but is quite inaccurate. Therefore, there arises a need to address the technical drawbacks in existing technologies to improve the performance of the VCO for a given power with an improved operating range.

SUMMARY

In view of the foregoing, embodiments herein provide a circuit for detecting, controlling, and maintaining optimal output swing for a noise performance at a given power with an improved operating range is provided. The circuit includes a Voltage Controlled Oscillator (VCO), a peak detection circuit and an Analog Bias Controller. The Voltage Controlled Oscillator (VCO) includes a bias control that is connected to the output swing of the VCO. The peak detection circuit is added at an output of the VCO. The peak detection circuit detects an output swing of the VCO and controls the output swing by controlling bias of the VCO using a feedback loop. An output voltage of the peak detection circuit is proportional to the output swing of the VCO. The Analog Bias Controller compares the output voltage of the peak detection circuit to a reference (VDD) to maintain the output swing of the VCO at a constant level that corresponds to an internally generated reference.

In some embodiments, an analog voltage of the peak detection circuit is used to bias the VCO.

In some embodiments, the feedback loop is at least one of an analog feedback loop or a digital feedback loop.

In some embodiments, the feedback loop changes the bias till the output swing of the VCO) reaches the internally generated reference given to the operational amplifier.

In some embodiments, the output swing of the VCO is maintained using swing level information with an analog or digital dual loop feedback system.

In some embodiments, the output of the peak detection circuit with an analog control and the bias of the VCO form the analog feedback loop for automatic swing control.

In some embodiments, the constant level is set with a reference voltage or a programmable target range at an output of the peak detection circuit.

In some embodiments, the output of the peak detection circuit is converted to a digital signal using converters. In some embodiments, the digital signal is used to program discrete bias voltages or current for the VCO with a digital logic loop to maintain the output of the VCO at a programmable range.

In some embodiments, the output of the peak detection circuit after the buffer is also used in biasing the VCO and/or buffer supply for a combined dual-loop settling and output swing optimization.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
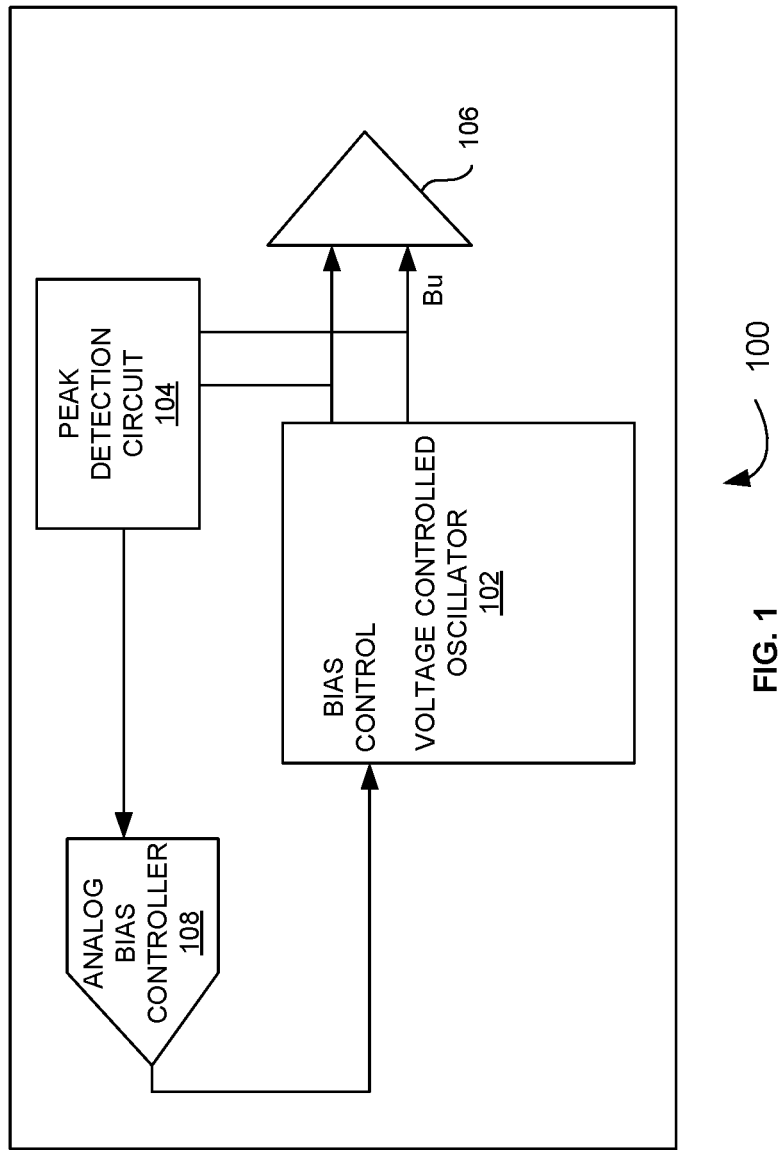
FIG. 1 is a block diagram that illustrates maintaining an optimal output swing of Voltage Controlled Oscillator (VCO) using a peak detection circuit and an Analog bias controller according to some embodiments herein.

The embodiments herein with their various features and advantages thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a peak detecting circuit at the output of a Voltage Controlled Oscillator (VCO) to detect swing levels and control the bias to maintain optimal output swing at the voltage Controlled Oscillator output for best noise performance at given power with an improved operating range.

Referring now to the drawings, and more particularly to FIGS. 1 through 10, where similar reference characters denote corresponding features consistently throughout the figures, there are shown preferred embodiments.

FIG. 1 is a block diagram 100 that illustrates maintaining an optimal output swing of a Voltage Controlled Oscillator (VCO) 102 using a peak detection circuit 104 and an Analog bias controller 108 according to some embodiments herein. The block diagram 100 includes the Voltage Controlled Oscillator (VCO) 102, the peak detection circuit 104, an output buffer 106, and the Analog bias controller 108. The peak detection circuit 104 is added at the output of the VCO 102, to bias the VCO 102 and to maintain the output swing using swing level information. The output of the peak detection circuit 104 with an analog control and VCO bias forms a control loop for automatic swing control where the voltage output of the peak detection circuit 104 is properly compared with a target reference voltage with an amplifier in negative feedback to ensure loop settles to an optimum point for the output swing VCO 102. An analog voltage of the peak detection circuit 104 can be used to bias the VCO 102 with an operational amplifier or passive devices present in the Analog Bias Controller 108 to maintain the swing at the output at a constant level with respect to an internally generated reference. In some embodiments, this reference can be a simple constant voltage reference generated using a bandgap or resistor voltage divider or more complex reference generation using the peak detection circuit 104 with temperature and supply compensated. In some embodiments, the constant level can be set with a reference voltage or programmable target range at the output of the peak detection circuit 104. In some embodiments, the VCO 102 may be a LC-based VCO. In some embodiments, the VCO 102 may be a Delay-based ring VCO, Grounded capacitor VCO, or an Emitter-Coupled VCO, etc.

In some embodiments, the output buffer 106 is at least one of a simple invertor buffer or an inductor tuned buffer or others based on output circuit requirement. The peak detection circuit 104 on the output of the output buffer 106 can also be used to improve the output swing of the VCO 102 in a digital or analog feedback scenario. This will help for higher frequency output or sensitive VCO designs as the loading effect of buffer can be seen at VCOs in some cases. The peak detection circuit 104 and the programmable Buffer will help in tuning the over all loop and output load for best performance. In some embodiments, the VCO is biased in one or more methods to control the output swing which is the bias that's controlled by the control loop. The one or more methods may depend on a type of the VCO 102 and architecture. In some embodiments, the VCO 102 includes an internal low-dropout regulator (LDO) to ensure the VCO 102 is supply variation independent.

Figure 2:
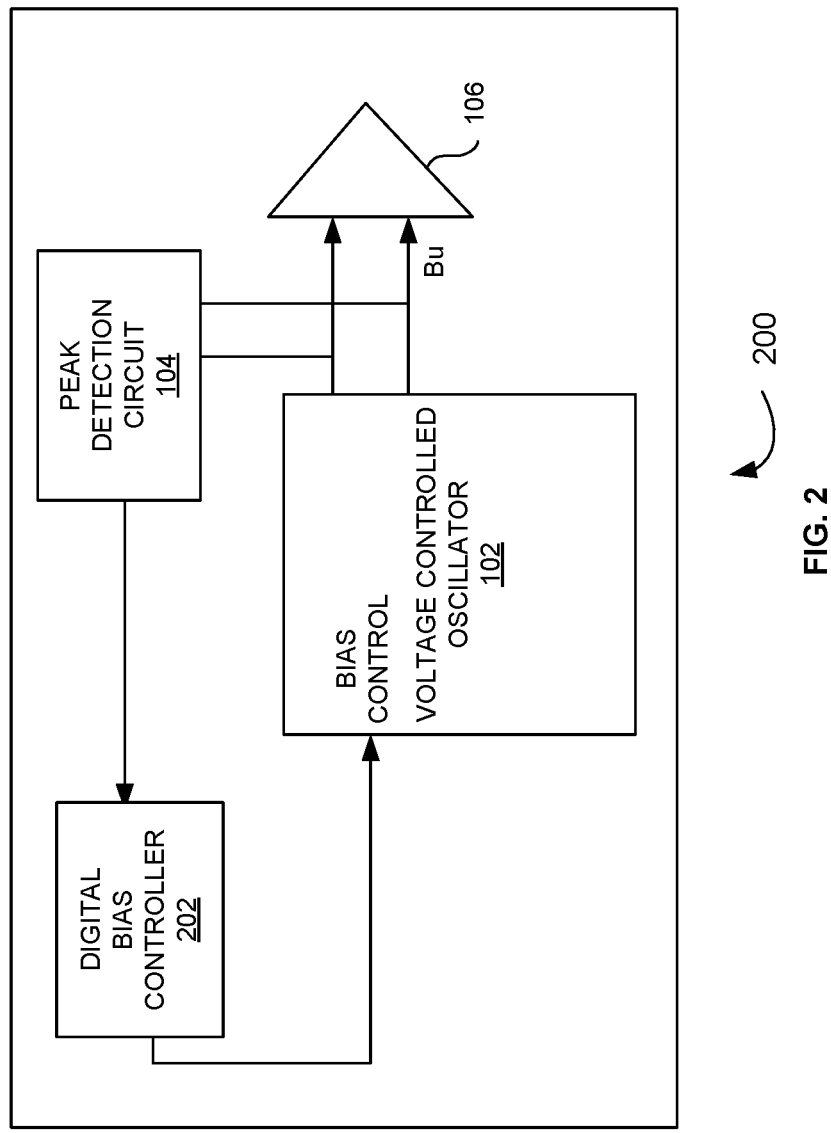
FIG. 2 is a block diagram that illustrates maintaining the optimal output swing of the VCO using a peak detection circuit and a Digital bias controller according to some embodiments herein.

FIG. 2 is a block diagram 200 that illustrates maintaining the optimal VCO 102 output swing using the peak detection circuit 104 and a Digital bias controller 202 according to some embodiments herein. The block diagram 200 includes the Voltage Controlled Oscillator (VCO) 102, the peak detection circuit 104, and the Digital bias controller 202. The output of the peak detection circuit 104 can be converted to a digital signal using converters with logic and this information can be used to program discrete bias voltages or currents for the VCO 102 with a digital logic loop to maintain the output of the VCO 102 at a programmable range using a programmable register memory as limits for the digital logic with an acceptable digitization error as there is a limitation of a comparator resolution and output programmable current or voltage circuit which will limit the loop accuracy for output swing.

Figure 3:
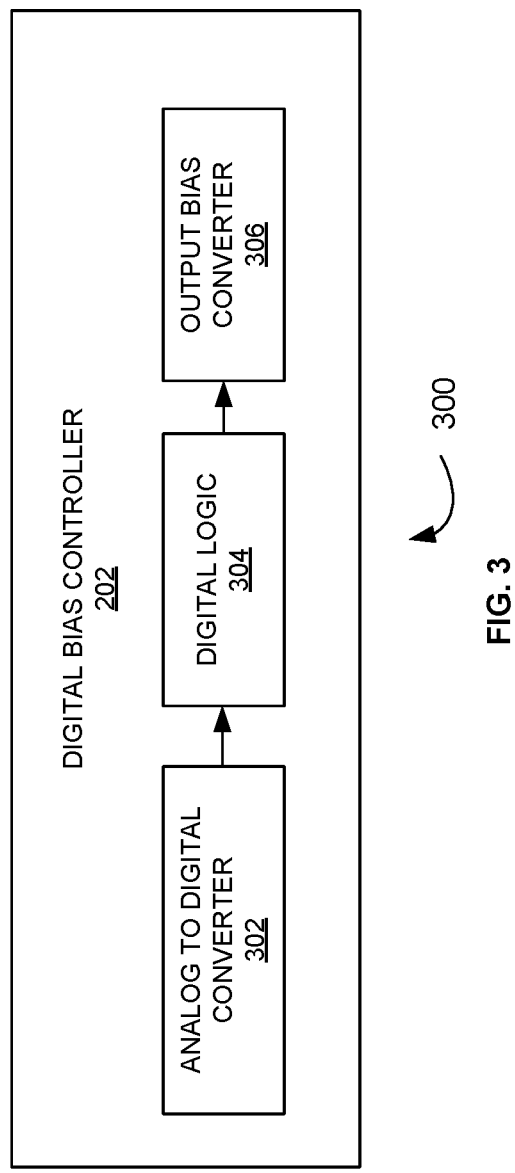
FIG. 3 is a block diagram of a digital bias controller according to some embodiments herein.

FIG. 3 is a block diagram 300 of the digital bias controller 202 according to some embodiments herein. The digital bias controller 202 includes an analog to digital converter 302, a digital logic 304 and an output bias converter 306. The analog to digital converter 302 converts an analog signal to a digital signal. The analog to digital converter 302, the digital logic 304 and the output bias converter 306 are used to control output swing at a constant level at the output of the peak detection circuit 104. In some embodiments, the digital bias controller 202 along with the peak detection circuit 104 forms a loop which can be itself part of a large tuning loop for the VCO 102 to calibrate for a required frequency and voltage swing simultaneously or one after other.

For the best noise performance, the output swing must be optimal. The output swing of the VCO 102 depends on multiple factors such as corner, temperature, frequency of operation, bias supply, etc. Either of the above block diagrams will ensure reduced power consumption across an operating range for the VCO 102 by ensuring the minimum bias voltages to meet best swings which is a lowest power consumption point. The power is directly proportional to the output swing at given frequency and corner, increased swing beyond supply rails don't improve noise performance or swings in comparison to the power consumed. The constant swing across frequency also improves output phase noise.

The operating range can be extended by enabling a higher level of bias range due to controlled output swing which could previously destroy the devices protecting the circuit from over swinging due to high Q, thereby extending lifetime of operation for a device.

Figure 4:
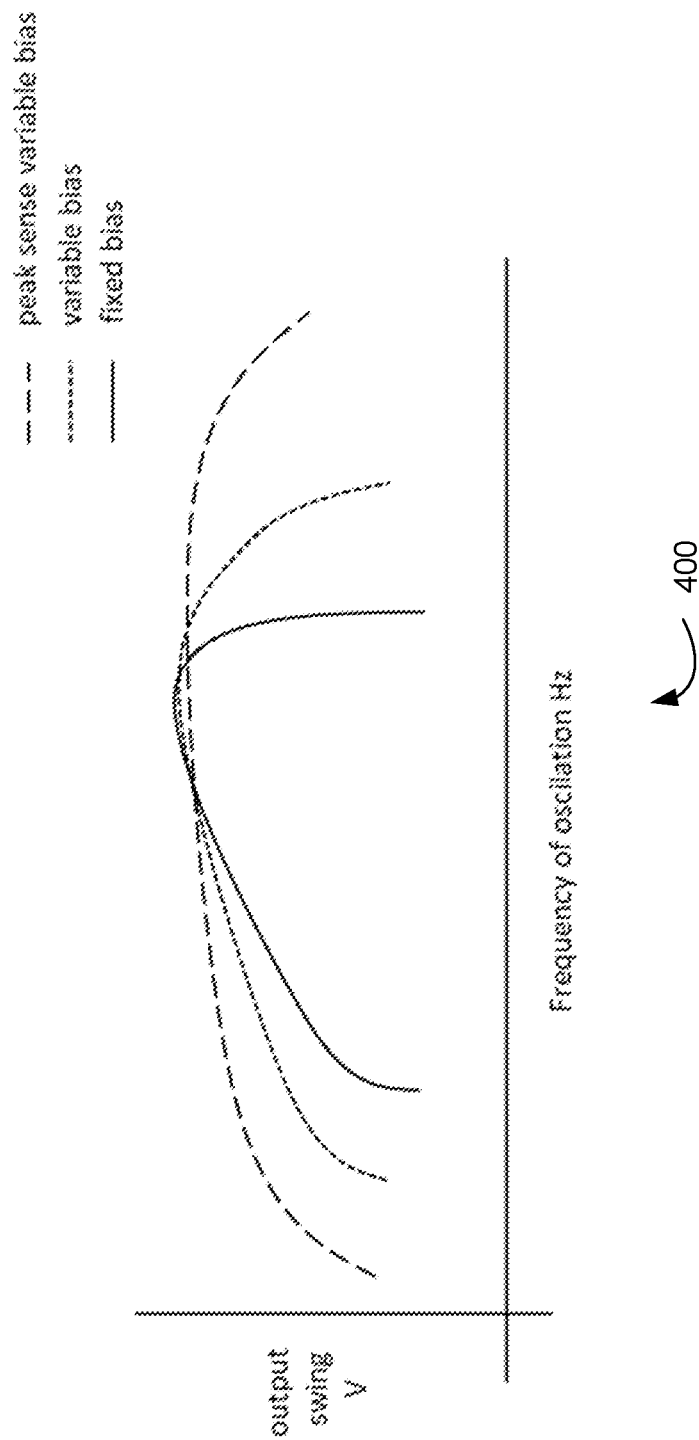
FIG. 4 is an exemplary graph that illustrates a variation of swing with frequency of operation according to some embodiments herein.

FIG. 4 is an exemplary graph 400 that illustrates variation of swing with frequency of operation according to some embodiments herein. The exemplary graph 400 depicts how the swing varies with frequency of operation. In this exemplary graph 400, frequency of oscillation is plotted in an X-axis and output swing is plotted in Y-axis. For a fixed bias VCO, Q varies heavily, and the output swing quickly changes and drops on both sides where it stops oscillating. The variable bias improves condition but is a blind approach as there is no information or protection for the output devices. This improves range and also reduces slope of swing variation but is dangerous and uncontrolled. By adding the sensing of the swing using peak detect the range can be safely increased significantly and only limited by process corners and power. This also protects the devices from swinging beyond limits.

Figure 5:
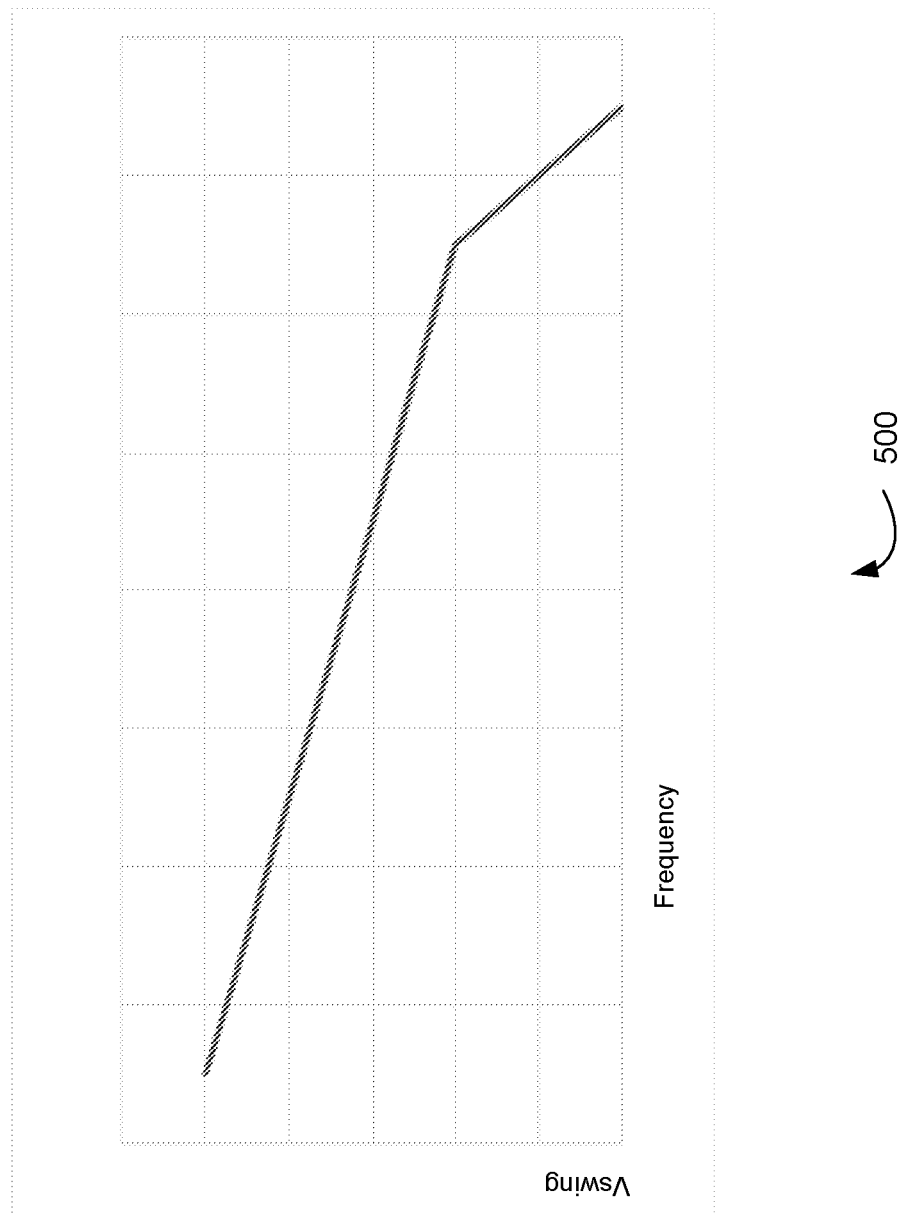
FIG. 5 is an exemplary graph that illustrates voltage swing of VCO output and with change in frequency of VCO according to some embodiments herein.

FIG. 5 is an exemplary graph 500 that illustrates voltage swing of VCO output and with change in frequency of the VCO 102 according to some embodiments herein. The exemplary graph 500 depicts how the swing varies with frequency of operation. In this exemplary graph 400, frequency is plotted in an X-axis and voltage swing is plotted in Y-axis.

Figure 6:
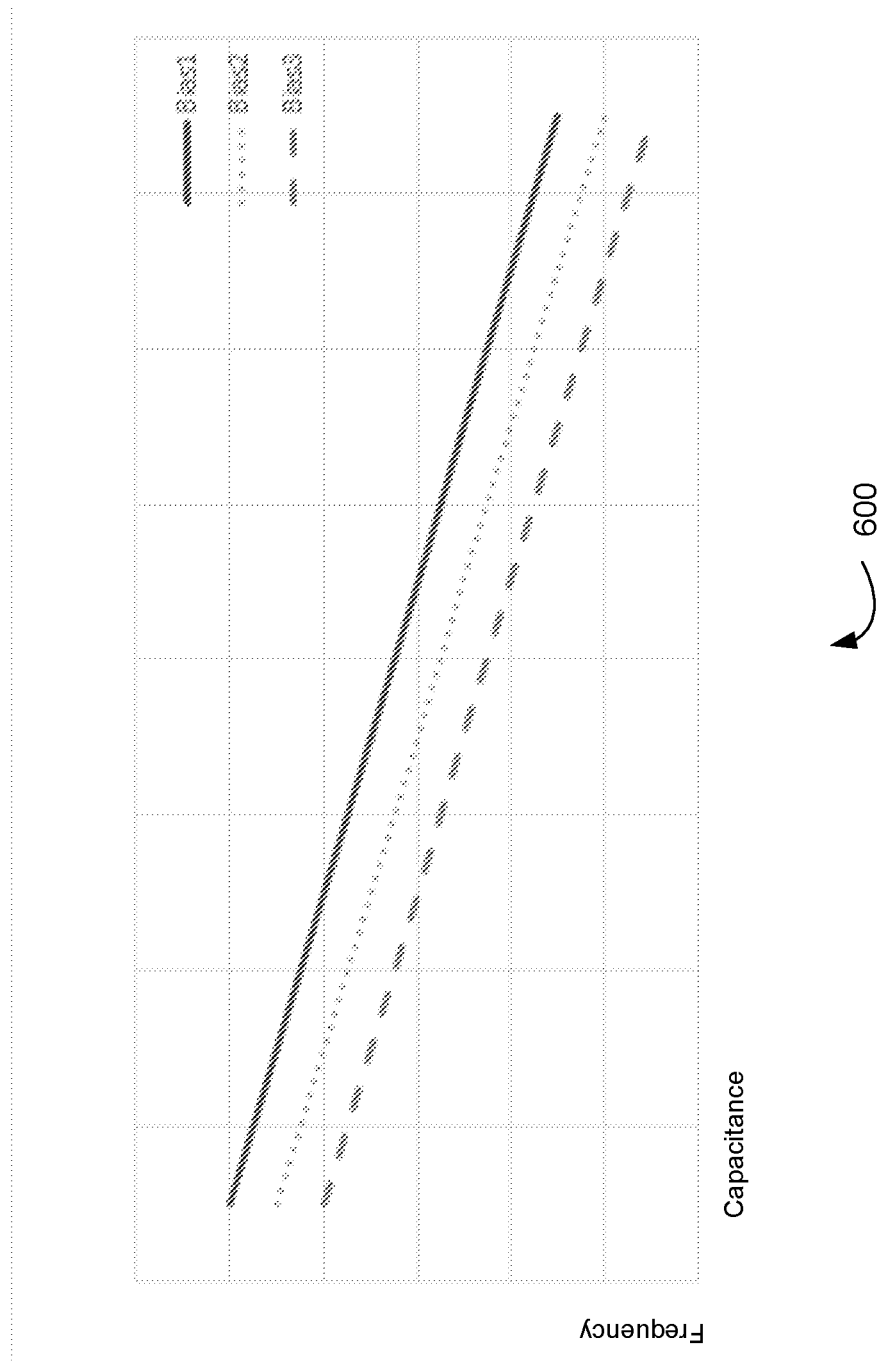
FIG. 6 is an exemplary graph that illustrates capacitance of the VCO and frequency with different bias points according to some embodiments herein.

FIG. 6 is an exemplary graph 600 that illustrates capacitance of the VCO 102 and frequency with different bias points according to some embodiments herein. In this exemplary graph 600, frequency is plotted in a Y-axis and capacitance is plotted in Y-axis. In the exemplary graph 600, Bias1 is greater than Bias2, and the Bias2 is greater than Bias3. In some embodiments, if bias is maintained within a threshold to prevent the VCO 102 from damage and a buffer which would age or burn out due to over voltage stress. Hence biasing the VCO 102 within the threshold has the following advantages: (i) Optimum swing at output, (ii) Optimum power consumption for required frequency of operation, (iii) extended range due to variable accurately controlled bias and (iv) optimum layout and metal utilization for all above considerations.

Figure 7:
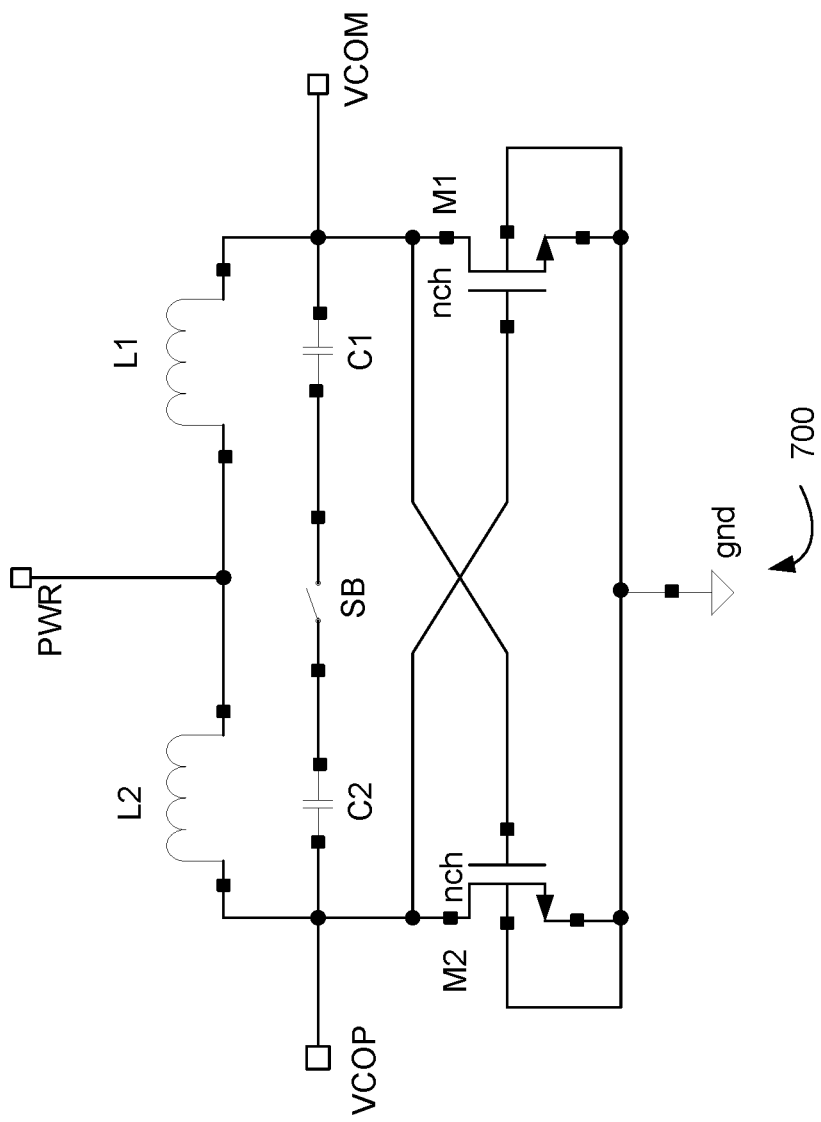
FIG. 7 is an exemplary circuit diagram of the VCO according to some embodiments herein.

FIG. 7 is an exemplary circuit diagram 700 of the VCO 102 according to some embodiments herein. The exemplary circuit diagram 700 depicts a standard LC VCO with NMOS cross couple. In some embodiments, any of the multiple forms such as CMOS, PMOS, etc. can be used in the exemplary circuit diagram 700. A Power tap in given circuit may be biased for the VCO 102 to work with optimum output swing.

Figure 8:
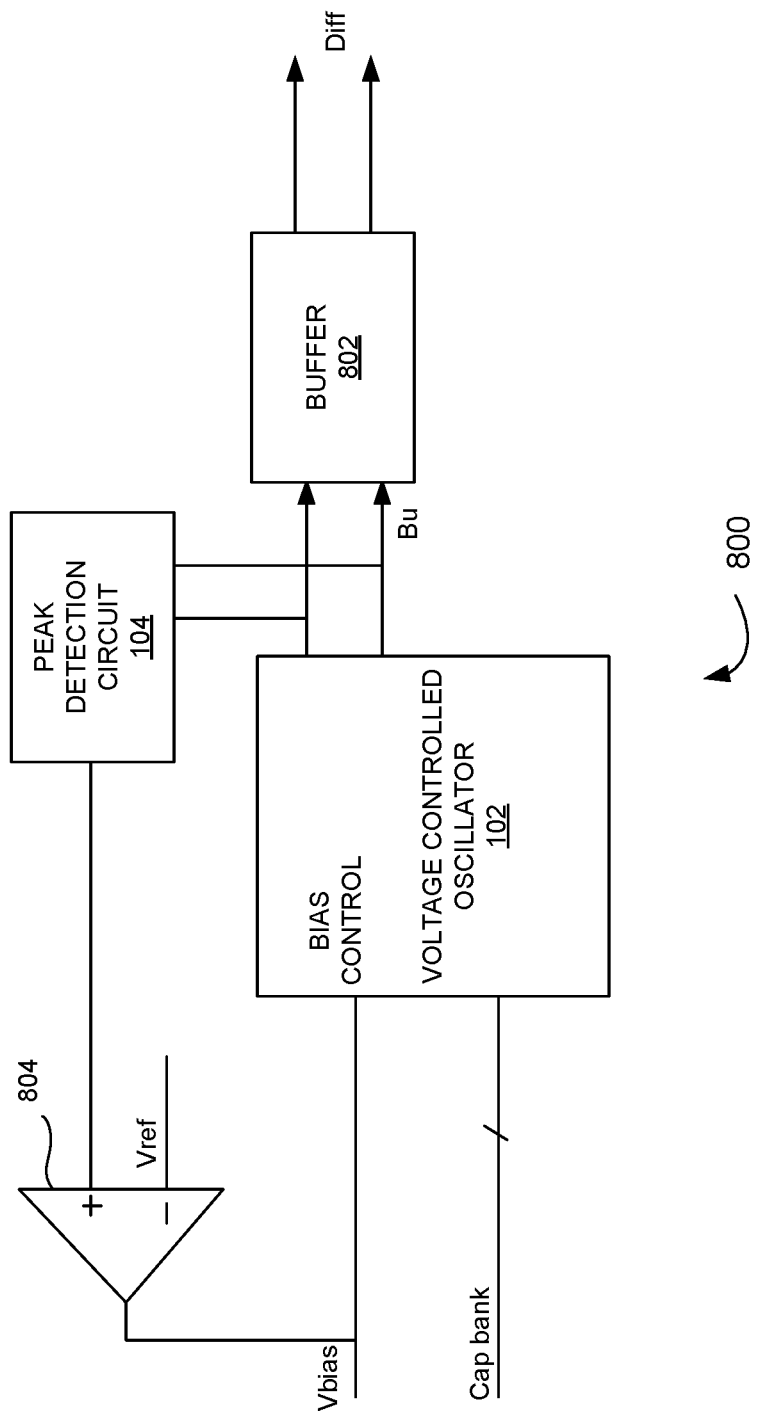
FIG. 8 is an exemplary diagram that illustrates connection of a analog swing control loop according to some embodiments herein.

FIG. 8 is an exemplary diagram 800 that illustrates connection of an analog swing control loop according to some embodiments herein. The exemplary diagram 800 includes the VCO 102, the peak detection circuit 104, and a buffer 802. In some embodiments, buffer post VCO ensures varying input swing is always converted to a full square wave swing output to be used for the VCO 102, the peak detection circuit 104, and the buffer 802.

An output voltage of the VCO 102 is proportional to output swing of the VCO 102. The output voltage of the VCO 102 is compared to voltage reference (close to VDD for best performance) to maintain the output swing of the VCO 102 at a constant level. The output is connected to the bias of the VCO 102. The analog swing control loop will increase the bias till the output swing of the VCO 102 reaches the reference given to an operational amplifier 804.

In some embodiments, a loop bandwidth can be low and phase margin set such that settling is clean to avoid overshoot. In some embodiments, a startup will require sequencing to properly settle the circuit. The circuit can start from min or max cap setting and allowed to start oscillating, then digital calibration for cap selection can be done post which analog loop can be enabled in a PLL. The swing loop will maintain the output swing across supply and temperature variation.

Let's consider, a LC-based VCO with fixed inductor (L) and switch cap-based (C). The switch that enables the capacitor will reduce the frequency of oscillation.

Frequency of operation $f=1/2\pi\sqrt{LC}$

Q of the circuit $Q=1/(1/Q_{swt}+1/Q_{cap}+1/Ql)$

In some embodiments, the switch has parasitic inductance and capacitances which degrade the Q of the circuit. Hence, more cap is enabled for reducing the frequency, but it will reduce the Q of the circuit. In some embodiments, the output swing depends on the Q of the circuit for the given frequency. Typically, this reduction persists until the oscillator ceases oscillation under prescribed bias current and configuration. Failure to establish a bias of sufficient magnitude may disable reaching the highest frequency.

Figure 9:
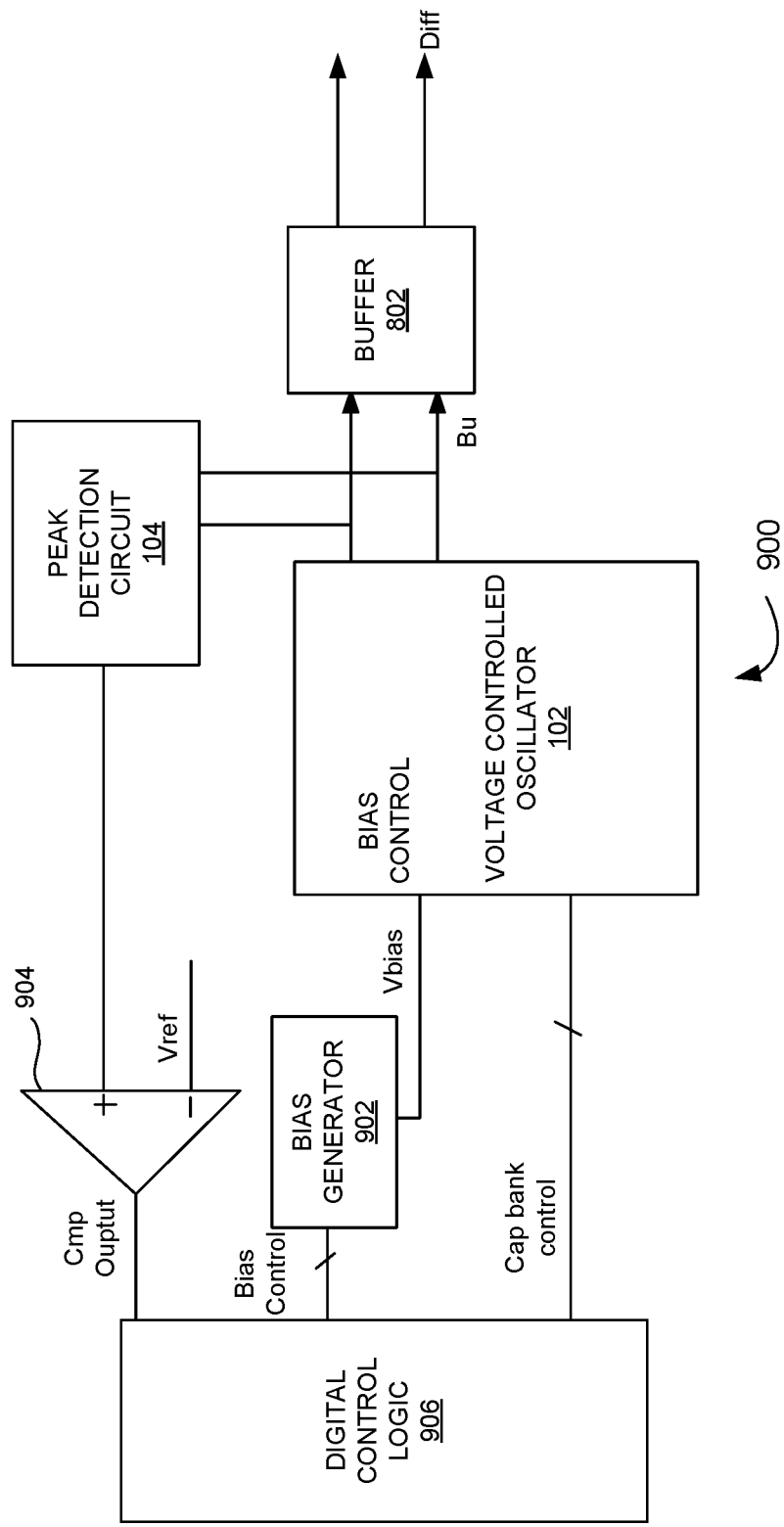
FIG. 9 is an exemplary diagram that illustrates connection for a digital swing control loop according to some embodiments herein.

FIG. 9 is an exemplary diagram 900 that illustrates connection for a digital swing control loop according to some embodiments herein. The exemplary diagram 900 includes the VCO 102, the peak detection circuit 104, the buffer 802, a bias generator 902, a comparator 904 and a digital control logic 906. In some embodiments, an output of the Peak detection circuit 104 is connected to the comparator 904. The comparator 904 may be single or multiple comparators and used to detect the swing level of the output of the VCO 102. The digital control logic 906 uses swing information to increase or decrease a bias control and change Vbias of the VCO 102 based on the output of the comparator 904. This gives a granular control for the output unlike an analog loop. In some embodiments, an error of the digital swing control loop will depend on an accuracy of the peak detection circuit 104 and comparator error and Vbias generation accuracy. In some embodiments, startup sequency in the digital swing control loop has information of swing level and frequency levels and can calibrate the frequency and swing together. In some embodiments, overshoots are inherently avoided as the digital swing control loop is digital and programing will limit max Vbias levels. With either analog or digital control the VCO performance will be improved to an uncontrolled non-feedback-based system.

Figure 10:
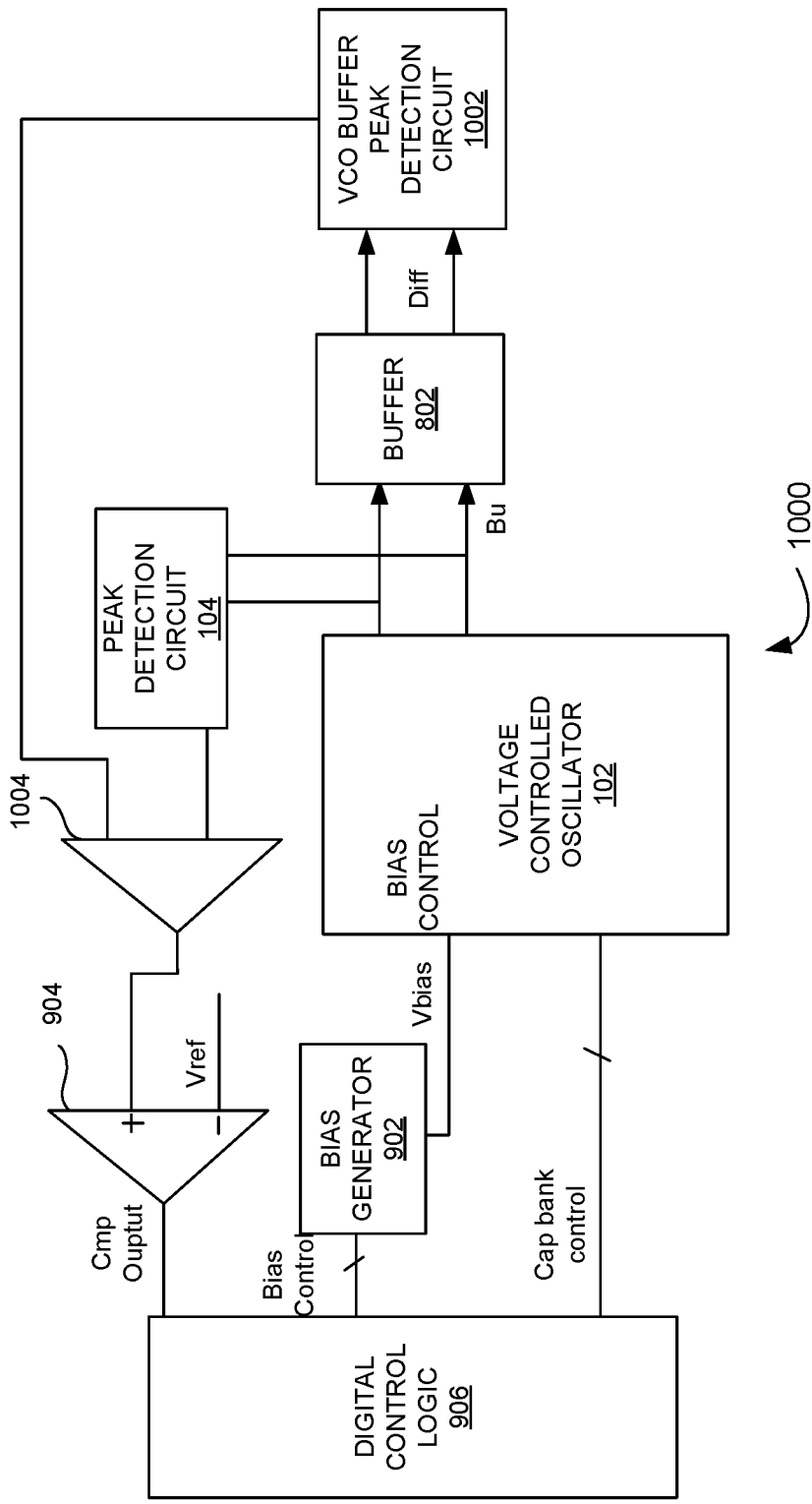
FIG. 10 is an exemplary diagram that illustrates an additional peak detection circuit at buffer output used with an additional digital or analog loop with weightage according to some embodiments herein.

FIG. 10 is an exemplary diagram 1000 that illustrates a VCO buffer peak detection circuit 1002 at buffer output used with an additional digital or analog loop with weightage according to some embodiments herein. The exemplary diagram 1000 includes the VCO 102, the peak detection circuit 104, the buffer 802, a bias generator 902, a comparator 904, a digital control logic 906, the VCO buffer peak detection circuit 1002, and a comparator 1004. The VCO buffer peak detection circuit 1002 can be another digital logic loop to tune output loop. In some embodiments, the VCO buffer peak detection circuit 1002 at the buffer 802 output is used with the additional digital or the analog loop with weightage to set the VCO bias or Buffer bias if buffer is also programmable.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A circuit for detecting, controlling, and maintaining optimal output swing for a noise performance at a given power with an improved operating range, comprising:
a Voltage Controlled Oscillator (VCO) that comprises a bias control that is connected to the output swing of the VCO;
Characterized in that,
a peak detection circuit that is added at an output of the VCO, wherein the peak detection circuit detects the output swing of the VCO and controls the output swing by controlling bias of the VCO using a feedback loop, wherein an output of the peak detection circuit after an output buffer is also used in biasing the VCO and/or buffer supply for a combined dual loop settling and output swing optimization, wherein an output voltage of the peak detection circuit is proportional to the output swing of the VCO; and
an Analog Bias Controller that compares the output voltage of the peak detection circuit to a reference (VDD) to maintain the output swing of the VCO at a constant level that corresponds to an internally generated reference.

2. The circuit of claim 1, wherein an analog voltage of the peak detection circuit is used to bias the VCO.

3. The circuit of claim 1, wherein the feedback loop is at least one of an analog feedback loop or a digital feedback loop.

4. The circuit of claim 1, wherein the feedback loop changes the bias till the output swing of the VCO reaches the internally generated reference given to the operational amplifier.

5. The circuit of claim 1, wherein the output swing of the VCO is maintained using swing level information with an analog or digital dual loop feedback system.

6. The circuit of claim 1, wherein the output of the peak detection circuit with an analog control and the bias of the VCO form the analog feedback loop for automatic swing control.

7. The circuit of claim 1, wherein the constant level is set with a reference voltage or a programmable target range at the output of the peak detection circuit.

8. A circuit for detecting, controlling, and maintaining optimal output swing for a noise performance at a given power with an improved operating range, comprising:
a Voltage Controlled Oscillator (VCO) that comprises a bias control that is connected to the output swing of the VCO;
characterized in that,
a peak detection circuit that is added at an output of the VCO, wherein the peak detection circuit detects the output swing of the VCO and controls the output swing by controlling bias of the VCO using a feedback loop, wherein an output of the peak detection circuit with an analog control and the bias of the VCO form an analog feedback loop for automatic swing control, wherein an output voltage of the peak detection circuit is proportional to the output swing of the VCO, wherein the output of the peak detection circuit is converted to a digital signal using converters, wherein the digital signal is used to program discrete bias voltages or current for the VCO with a digital logic loop to maintain the output of the VCO at a programmable range using register memory or other local memory options; and
an analog Bias Controller that compares the output voltage of the peak detection circuit to a reference (VDD) to maintain the output swing of the VCO at a constant level that corresponds to an internally generated reference.

9. The circuit of claim 8, wherein an analog voltage of the peak detection circuit is used to bias the VCO.

10. The circuit of claim 8, wherein the feedback loop is at least one of the analog feedback loop or a digital feedback loop.

11. The circuit of claim 8, wherein the feedback loop changes the bias till the output swing of the VCO reaches the internally generated reference given to the operational amplifier.

12. The circuit of claim 8, wherein the output swing of the VCO is maintained using swing level information with an analog or digital dual loop feedback system.

13. The circuit of claim 8, wherein the constant level is set with a reference voltage or a programmable target range at an output of the peak detection circuit.

* * * * *